(12) United States Patent
Wang et al.

(10) Patent No.: US 11,327,137 B2
(45) Date of Patent: May 10, 2022

(54) ONE-DIMENSIONAL PARTIAL FOURIER PARALLEL MAGNETIC RESONANCE IMAGING METHOD BASED ON DEEP CONVOLUTIONAL NETWORK

(71) Applicant: SHENZHEN INSTITUTES OF ADVANCED TECHNOLOGY, Guangdong (CN)

(72) Inventors: Shanshan Wang, Guangdong (CN); Dong Liang, Guangdong (CN); Ningbo Huang, Guangdong (CN); Xin Liu, Guangdong (CN); Hairong Zheng, Guangdong (CN)

(73) Assignee: SHENZHEN INSTITUTES OF ADVANCED TECHNOLOGY, Guangdong (CN)

( * ) Notice: Subject to any disclaimer, the term of this patent is extended or adjusted under 35 U.S.C. 154(b) by 268 days.

(21) Appl. No.: 16/761,285

(22) PCT Filed: Jun. 6, 2017

(86) PCT No.: PCT/CN2017/087233
§ 371 (c)(1),
(2) Date: May 4, 2020

(87) PCT Pub. No.: WO2018/223275
PCT Pub. Date: Dec. 13, 2018

(65) Prior Publication Data
US 2020/0355774 A1 Nov. 12, 2020

(51) Int. Cl.
*G01R 33/561* (2006.01)
*G01R 33/00* (2006.01)
*G06N 3/08* (2006.01)

(52) U.S. Cl.
CPC ...... *G01R 33/5611* (2013.01); *G01R 33/0029* (2013.01); *G01R 33/5615* (2013.01); *G06N 3/08* (2013.01)

(58) Field of Classification Search
None
See application file for complete search history.

(56) References Cited

FOREIGN PATENT DOCUMENTS

| CN | 105657402 A | 6/2016 |
|---|---|---|
| CN | 106056647 A | 10/2016 |
| CN | 106600538 A | 4/2017 |

OTHER PUBLICATIONS

"Accelerating Magnetic Resonance Imaging Via Deep Learning" Wang et al. 2016, 2016 IEEE 13th International Symposium on Biomedical Imaging (ISBI) pp. 514-517 (Year: 2016).*

(Continued)

*Primary Examiner* — Douglas X Rodriguez
(74) *Attorney, Agent, or Firm* — Duane Morris LLP (57) ABSTRACT

The present disclosure relates to a 1D partial Fourier parallel magnetic resonance imaging method with a deep convolutional network and belongs to the technical field of magnetic resonance imaging. The method includes steps of: creating a sample set and a sample label set for training; constructing an initial deep convolutional network model; inputting a training sample of the sample set to the initial deep convolutional network model for forward process, comparing an output result of the forward process with an expected result in the sample label set, and performing training with a gradient descent method until a parameter of each layer which enables consistency between the output result and the expected result to be maximum is obtained; creating an optimal deep convolutional network model by using the obtained parameter of the each layer; and inputting a multi-coil undersampled image sampled online to the optimal deep convolutional network model, performing the forward pro- (Continued)

cess on the optimal deep convolutional network model, and outputting a reconstructed single-channel full-sampled image. The present disclosure can well remove the noise of the reconstructed image, reconstruct a magnetic resonance image with a better visual effect, and has high practical value.

18 Claims, 5 Drawing Sheets

(56) References Cited

OTHER PUBLICATIONS

International Search Report issued in connection with International Patent Application No. PCT/CN2017/087233, dated Mar. 6, 2018, 4 pages.

He, Linyang, "Research on Key Techniques of Super Resolution Reconstruction of Aerial Images", Aug. 15, 2016, 175 pages.

* cited by examiner

FIG. 3B (A) Full-sampled image  (B) One-dimensional uniform under-sampling pattern  (C) Hamming filtered 1D low frequency undersampling pattern at an acceleration factor of 3 (left shifted 23 columns from the k-space center)

(D) Reconstruction image by SPIRiT  (E) Reconstruction image by GRAPPA  (F) Reconstruction image of the present disclosure

FIG. 4

ONE-DIMENSIONAL PARTIAL FOURIER PARALLEL MAGNETIC RESONANCE IMAGING METHOD BASED ON DEEP CONVOLUTIONAL NETWORK

CROSS-REFERENCES TO RELATED APPLICATIONS

This is a U.S. National Stage Application, filed under 35 U.S.C. 371, of International Patent Application No. PCT/CN2017/087233, filed on Jun. 6, 2017, the content of which is incorporated herein by reference in its entirety.

TECHNICAL FIELD

The present disclosure relates to the technical field of magnetic resonance imaging, and in particular to a one-dimensional partial Fourier parallel magnetic resonance imaging method based on a deep convolutional network.

BACKGROUND

The parallel imaging technology is usually used for accelerating the scanning imaging of clinical magnetic resonance imaging equipment, and the technology adopts a plurality of receiving coil arrays to simultaneously acquire data, reduces the phase encoding steps under the condition of keeping the spatial resolution not to be attenuated, performs undersampling on K space, greatly shortens the magnetic resonance scanning time and improves the imaging speed. The parallel imaging technology needs to perform various transformations on data of each coil and adopts a reconstruction algorithm to perform image reconstruction so as to obtain an expected image, so that the accurate multi-coil undersampling magnetic resonance image reconstruction method is very important.

Researchers have developed various multi-coil undersampling magnetic resonance image reconstruction algorithms, where generalized auto-calibrating partially parallel acquisitions (GRAPPA) and SPIRiT algorithms which are based on K-space interpolation achieves a good effect by using coil sensitivity information implicitly through check line data. GRAPPA and SPIRiT both generate unsampled data points by weighting the sampled data points around the unsampled points, the weighting coefficients are obtained by self-checking a full-sampled check line, and then an image scanned by each coil is generated by Fourier transform.

Specifically, the GRAPPA reconstructs an un-acquired data line through a reconstruction patch, and the reconstruction of the data line of the jth coil with the offset m from the sampled data line is taken as an example, where the GRAPPA reconstruction formula (1) is as follows:

$$S_j(k_y - m\Delta k_y) = \sum_{l}^{L} \sum_{b}^{N_b-1} n(j, b, l, m) S_l(k_y - bR\Delta k_y). \tag{1}$$

$N_b$ denotes the number of reconstruction patches during the reconstruction process. n(j, b, l, m) is a weight coefficient, l is an index of a coil, and b is an index of a reconstruction patch.

Similar to the GRAPPA algorithm, the SPIRiT algorithm also generates the unsampled K-space data by weighting the K-space data in its neighborhood. The difference is that the weighting uses not only sampled data, but also unsampled data generated iteratively. The SPIRiT algorithm can determine the reconstruction relationship between sampling points better. $x_i(r)$ denotes unsampled K-space data of the ith coil, r denotes the position of a data point in K space, $R_r$ denotes an operator for selecting a required point from K space, and $R_{r,x_i}$ denotes all data adjacent to the position r, the $x_i(r)$ reconstruction formula (2) is as follows:

$$x_i(r) = \sum_{j}^{N_C} g_{ji}^H (R_r x_j). \tag{2}$$

$g_{ji}$ is referred to as the SPIRiT kernel, $g^H_{ji}$ is the conjugate transpose of $g_{ji}$ (where $g_{ji}$ is obtained by auto-calibration of a piece of partially full-sampled K-space data) and $N_c$ is the total number of coils.

The currently popular magnetic resonance reconstruction methods GRAPPA and SPIRiT achieve a good effect when a triple one-dimensional uniform undersampling pattern is used, but the two methods are too slow in reconstruction speed, and the reconstructed image contains a large amount of noise, and the visual effect is unsatisfactory. Therefore, a method that is faster and can eliminate noise in the reconstructed image is needed.

SUMMARY

In order to overcome the defects in the existing art, the present disclosure provides a one-dimensional partial Fourier parallel magnetic resonance imaging method based on a deep convolutional neural network (DCNN).

The deep convolutional neural network (also referred to as the deep convolutional network) is a multilayer neural network, has the characteristics of local connection and weight sharing, and therefore has unique superiority in the aspect of image processing, the complexity of the network is reduced by weight sharing, and particularly the complexity of data reconstruction in the processes of feature extraction and classification is avoided by the characteristic that images of multidimensional input vectors can be directly input into the network, so that the image processing can be accelerated. In addition, the deep convolutional network also has an important characteristic in image processing, that is, original signal characteristics can be enhanced and noise can be reduced through convolution operation so as to obtain a clearer, less-noise and better-visual image.

Therefore, the present disclosure provides a one-dimensional partial Fourier parallel magnetic resonance imaging method based on a deep convolutional network. The method includes the following steps:

S1) creating, based on an existing undersampled multi-channel magnetic resonance image, a sample set and a sample label set for training; S2) constructing an initial deep convolutional network model including an input layer, L convolutional layers and an output layer which are sequentially connected; S3) inputting a training sample (x, y) of the sample set to the initial deep convolutional network model for forward process, comparing an output result of the forward process with an expected result in the sample label set, and performing training by using a gradient descent method until a parameter of each layer which enables consistency between the output result and the expected result to be maximum is obtained; S4) creating an optimal deep convolutional network model by using the obtained parameter of the each layer; and S5) inputting a multi-coil undersampled image sampled online to the optimal deep convolutional network model, performing the forward process on the optimal deep convolutional network model, and outputting a reconstructed single-channel full-sampled image.

In an embodiment, in the step S1, a training sample in the sample set is a coincident undersampled image extraction patch extracted from an existing multi-coil undersampled image offline, and a sample label in the label set is a square root of a sum of squares of a full-sampled multi-channel image extraction patch corresponding to the undersampled image extraction patch.

In an embodiment, the input image (i.e., the undersampled imaged image) and the marker image (i.e., the fully-sampled imaged image) may be segmented into image patch pairs (the undersampled image extraction patch $x_{t,n}$ and the fully-sampled image extraction patch $y_{t,n}$) in such a manner as to increase the number of samples, and these image patch pairs may overlap in the same image.

The undersampled image extraction patch as a training sample may be obtained as follows:

$$\arg\min_{\Theta}\left\{\frac{1}{2TN}\sum_{t=1}^{T}\sum_{n=1}^{N}\|C(x_{t,n};\Theta)-y_{t,n}\|_2^2\right\}.$$

C is an end-to-end mapping relationship estimated with a hidden layer parameter $\Theta=\{(W_1,b_1), \ldots (W_l,b_l), \ldots (W_L,b_L)\}$, T is a number of samples extracted from an image, and N is a total number of images.

In an embodiment, the existing multi-coil undersampled image offline is obtained by undersampling a K-space multi-coil full-sampled image with a Hamming filtered 1D low frequency undersampling pattern at an acceleration factor of 3 (left shifted 23 columns from the k-space center), such undersampling pattern has the advantage that an undersampled image sample set with a higher quality can be obtained compared with the one-dimensional uniform undersampling pattern used by the conventional GRAPPA and SPIRiT. The higher the quality of the training sample set, the better the deep convolutional network model.

In an embodiment, in the step 2, the L convolutional layers of the initial deep convolutional network model are created in a following manner:

$$\begin{cases} C_0 = x \\ C_1 = \sigma(W_1 * x + b_1) \\ C_l = \sigma(W_l * C_{l-1} + b_l), l \in 2, \ldots, L-1 \\ C_L = \sigma(W_L * C_{L-1} + b_L) \end{cases}$$

C denotes a convolutional layer and x denotes an input sample; in a formula, $W_1$ is a convolution operator of a first convolutional layer $C_1$ and is equal to $c \times M_1 \times M_1 \times n_1$, $b_1$ is an element-related n-dimensional offset, c is a number of image channels, $M_1$ is a filter size and $n_1$ is a number of filters; $W_l$ is a convolution operator of a l-th convolutional layer $C_l$ and is equal to $n_{l-1} \times M_l \times M_l \times n_l$, $b_l$ is an element-related n-dimensional offset, $M_l$ is a filter size and $n_l$ is a number of filters; $W_L$ is a convolution operator of a last convolutional layer $C_L$ and is equal to $n_{L-1} \times M_L \times M_L \times c$, wherein $b_L$ is an element-related $n_L$-dimensional offset, c is a number of image channels, $M_L$ is a filter size, and $n_L$ is a number of filters.

In an embodiment, the initial deep convolutional network model further includes activation layers connected to one or more of the L convolutional layers.

In an embodiment, the initial deep convolutional network model includes the input layer, a first convolutional layer, a second convolutional layer, a third convolutional layer and the output layer, where the first convolutional layer is connected to a first activation layer and the second convolutional layer is connected to a second activation layer.

In an embodiment, the activation layers use a ReLu activation function.

In an embodiment, the output layer uses an EuclideanLoss function.

In an embodiment, the gradient descent method in the step S3 includes the steps described below.

In S31), for the training sample (x, y), a gradient of the last convolutional layer $C_L$ is calculated according to the following formula:

$$\delta^L = \frac{\partial J}{\partial b_L} = \frac{\partial J}{\partial D_L}\frac{\partial D_L}{\partial b_L} = C_L - y, \text{ where } \frac{\partial D_l}{\partial b_l} = 1 \text{ and } C_l = \sigma(D_l).$$

In S32), a gradient of an lth-layer nonlinear mapping layer of $\delta^l$ is updated by the following formula:

$$\delta^l = \frac{\partial J}{\partial b_l} = \frac{\partial J}{\partial D_{l+1}}\frac{\partial D_{l+1}}{\partial C_l}\frac{\partial C_l}{\partial D_l} = (\delta^{l+1} * W^{l+1}) \circ \frac{\partial(D^l)}{\partial D^l},$$

where * denotes a cross-correlation operation, and ° denotes that array elements are sequentially multiplied.

In S33), a gradient of each convolutional layer is obtained as:

$$\begin{cases} \frac{\partial J}{\partial W_l} = \frac{\partial J}{\partial D^l}\frac{\partial D^l}{\partial W_l} = \delta^l * D^{l-1} \\ \frac{\partial J}{\partial b_l} = \frac{\partial J}{\partial D^l}\frac{\partial D^l}{\partial b_l} = \frac{\partial J}{\partial D^l} = \delta^l \end{cases}.$$

In S34), a parameter of each convolutional layer is updated based on the calculated gradient of each convolutional layer.

In another aspect, the present disclosure further provides a computer readable medium, which is configured to store programs. The programs are computer-executable and cause the computer to perform the processing including the steps described above.

In another aspect, the present disclosure further provides a one-dimensional partial Fourier parallel magnetic resonance imaging apparatus based on a deep convolutional network.

The apparatus includes: a module configured to create, based on an existing undersampled multi-channel magnetic resonance image, a sample set and a sample label set for training; a module configured to construct an initial deep convolutional network model including an input layer, L convolutional layers and an output layer which are sequentially connected; a module configured to input a training sample (x, y) of the sample set to the initial deep convolutional network model for forward process, compare an output result of the forward process with an expected result in the sample label set, and perform training by using a gradient descent method until a parameter of each layer which enables consistency between the output result and the expected result to be maximum is obtained; a module configured to create an optimal deep convolutional network model by using the obtained parameter of the each layer; and a module configured to input a multi-coil undersampled image sampled online to the optimal deep convolutional network model, perform the forward process on the optimal deep convolutional network model, and output a reconstructed single-channel full-sampled image.

In an embodiment, in the module configured to create, based on the existing undersampled multi-channel magnetic resonance image, the sample set and the sample label set for the training, a training sample in the sample set is a coincident undersampled image extraction patch extracted from an existing multi-coil undersampled image offline, and a sample label in the label set is a square root of a sum of squares of a full-sampled multi-channel image extraction patch corresponding to the undersampled image extraction patch.

In an embodiment, the undersampled image extraction patch as the training sample is obtained according to the following formula:

$$\arg\min_{\Theta}\left\{\frac{1}{2TN}\sum_{t=1}^{T}\sum_{n=1}^{N}\|C(x_{t,n};\Theta)-y_{t,n}\|_2^2\right\}.$$

x is the undersampled image extraction patch, y is the corresponding full-sampled image extraction patch, C is an end-to-end mapping relationship estimated with a hidden layer parameter $\Theta=\{(W_1,b_1),\ldots(W_l,b_l),\ldots(W_L,b_L)\}$, T is a number of samples extracted from an image, and N is a total number of images.

In an embodiment, the existing offline multi-coil undersampled image is obtained by undersampling a K-space multi-coil full-sampled image by using a Hamming filtered 1D low frequency undersampling pattern at an acceleration factor of 3 (left shifted 23 columns from the k-space center).

In an embodiment, in the module configured to construct the initial deep convolutional network model including the input layer, the L convolutional layers and the output layer which are sequentially connected, the L convolutional layers of the initial deep convolutional network model are created in the following manner:

$$\begin{cases} C_0 = x \\ C_1 = \sigma(W_1 * x + b_1) \\ C_l = \sigma(W_l * C_{l-1} + b_l), l \in 2,\ldots,L-1 \\ C_L = \sigma(W_L * C_{L-1} + b_L) \end{cases}.$$

C denotes a convolutional layer and x denotes an input sample; in a formula, $W_1$ is a convolution operator of a first convolutional layer $C_1$ and is equal to $c\times M_1\times M_1\times n_1$, $b_1$ is an element-related n-dimensional offset, c is a number of image channels, $M_1$ is a filter size and $n_1$ is a number of filters; $W_l$ is a convolution operator of a l-th convolutional layer $C_l$ and is equal to $n_{l-1}\times M_l\times M_l\times n_l$, $b_l$ is an element-related $n_l$-dimensional offset, $M_l$ is a filter size and $n_l$ is a number of filters; $W_L$ is a convolution operator of a last convolutional layer $C_L$ and is equal to $n_{L-1}\times M_L\times M_L\times c$, where $b_L$ is an element-related $n_L$-dimensional offset, c is a number of image channels, $M_L$ is a filter size, and $n_L$ is a number of filters.

In an embodiment, the initial deep convolutional network model further includes activation layers connected to one or more of the L convolutional layers.

In an embodiment, the initial deep convolutional network model includes the input layer, a first convolutional layer, a second convolutional layer, a third convolutional layer and the output layer, where the first convolutional layer is connected to a first activation layer and the second convolutional layer is connected to a second activation layer.

In an embodiment, the activation layers use a ReLu activation function.

In an embodiment, the output layer uses an EuclideanLoss function.

In an embodiment, the gradient descent method includes the steps described below.

In S31), for the training sample (x, y), a gradient of the last convolutional layer $C_L$ is calculated according to the following formula:

$$\delta^L = \frac{\partial J}{\partial b_L} = \frac{\partial J}{\partial D_L}\frac{\partial D_L}{\partial b_L} = C_L - y,$$

where $\frac{\partial D_l}{\partial b_l} = 1$ and $C_l = \sigma(D_l)$.

In S32), a gradient of an lth-layer nonlinear mapping layer of $\delta^l$ is updated by the following formula:

$$\delta^l = \frac{\partial J}{\partial b_l} = \frac{\partial J}{\partial D_{l+1}}\frac{\partial D_{l+1}}{\partial C_l}\frac{\partial C_l}{\partial D_l} = (\delta^{l+1} * W^{l+1}) \circ \frac{\partial(D^l)}{\partial D^l},$$

where * denotes a cross-correlation operation, and ° denotes that array elements are sequentially multiplied.

In S33), a gradient of each convolutional layer is obtained as:

$$\begin{cases} \frac{\partial J}{\partial W_l} = \frac{\partial J}{\partial D^l}\frac{\partial D^l}{\partial W_l} = \delta^l * D^{l-1} \\ \frac{\partial J}{\partial b_l} = \frac{\partial J}{\partial D^l}\frac{\partial D^l}{\partial b_l} = \frac{\partial J}{\partial D^l} = \delta^l \end{cases}.$$

In S34), a parameter of each convolutional layer is updated based on the calculated gradient of each convolutional layer.

Based on the above advantages of the deep convolutional network, the present disclosure trains the deep convolutional network to learn a nonlinear relationship between the undersampled image and the full-sampled image by inputting a large number of existing undersampled multi-channel magnetic resonance images as samples into the deep convolutional network and inputting vectors associated with the full-sampled images corresponding to the undersampled images as labels of the samples. The nonlinear relationship is then used as a predictor to reconstruct the magnetic resonance image online, so that the magnetic resonance image can be reconstructed more quickly, and a clearer, less-noise and better-visual magnetic resonance reconstructed image can be obtained.

DETAILED DESCRIPTION

Specific embodiments of the present disclosure will be described below in conjunction with the drawings. In the specific embodiments described hereinafter of the present disclosure, some specific features are described for a better understanding of the present disclosure and all the specific features are not essential features for implementing the present disclosure, which is apparent to those skilled in the art. The specific embodiments described hereinafter of the present disclosure are merely exemplary specific embodiments of the present disclosure and not intended to limit the present disclosure.

Figure 1:
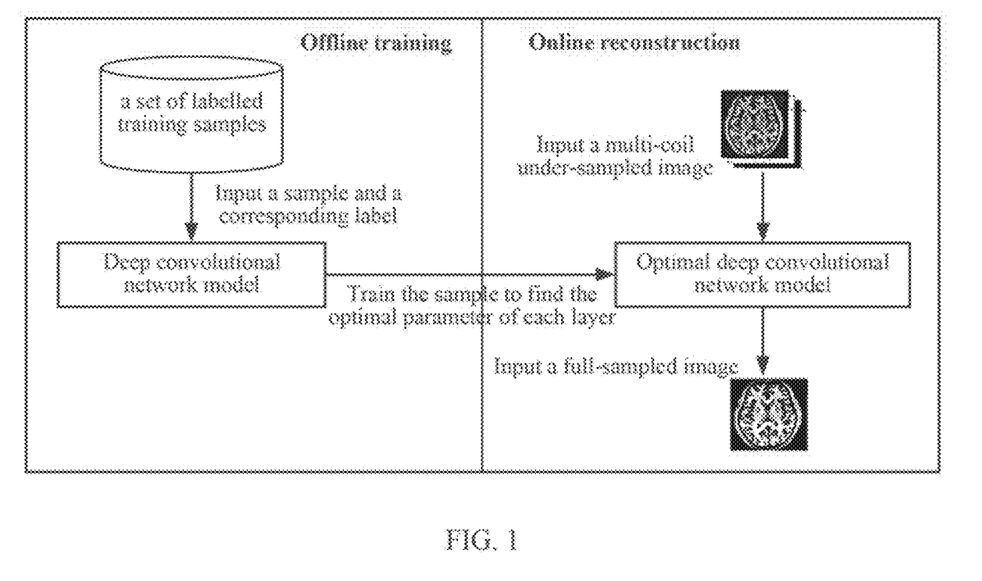
FIG. 1 is a general concept of a one-dimensional partial Fourier parallel magnetic resonance imaging method based on a deep convolutional network according to the present disclosure.
Figure 2:
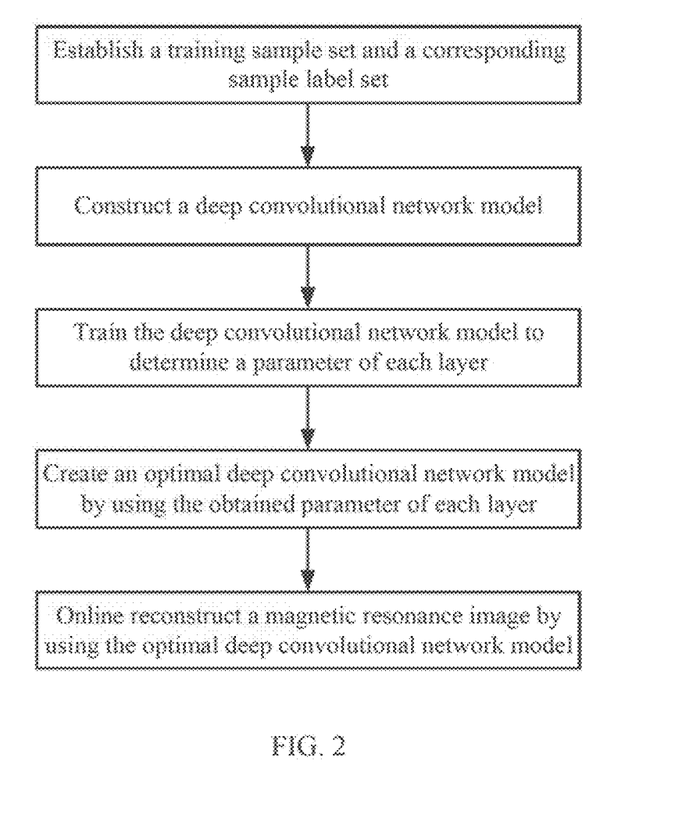
FIG. 2 is a flowchart of a method of the present disclosure.

FIG. 1 is a general concept of a one-dimensional partial Fourier parallel magnetic resonance imaging method based on a deep convolutional network according to the present disclosure, which mainly includes two parts: offline training of a deep convolutional network model and online reconstruction of a magnetic resonance image.

Firstly, the samples in the training sample set and the labels corresponding to the samples in the sample label set are input into the created deep convolutional network model for training, the deep convolutional network is trained to learn a nonlinear mapping relationship between undersampled images and fully sampled images, that is, an optimal deep convolutional network model is established, and then the optimal deep convolutional network model is used as a predictor to reconstruct magnetic resonance images online.

Training the deep convolutional network offline includes constructing a deep convolutional network model and training samples. Construction of the deep convolutional network model and the offline training process are described hereinafter in detail in conjunction with the drawings. The construction and training of the deep convolutional network model of the present disclosure basically includes the steps described below.

(1) A training sample set and a corresponding sample label set are established.

The sample set and the sample label set for training are created based on a large number of existing undersampled multi-channel magnetic resonance images.

In a preferred embodiment, a training sample may be a coincident undersampled image extraction patch extracted from an existing offline multi-coil undersampled image, and a sample label may be a square root of a sum of squares of a full-sampled multi-channel image extraction patch corresponding to the undersampled image extraction patch.

In a specific embodiment, a size of the image extraction patch extracted as a sample may be 33×33×12 and a size of the label may be 17×17, but the present disclosure is not limited thereto, and image extraction patches in other sizes and labels may also be used as samples.

The selection of a sample set is crucial to the construction of the optimal deep convolutional network. Therefore, in a preferred embodiment of the present disclosure, the field of view of the K space is provided with an asymmetric undersampled mask along a predetermined dimension, and Hamming filtering is performed on the undersampled mask to obtain a corresponding undersampled trajectory.

Figure 4:
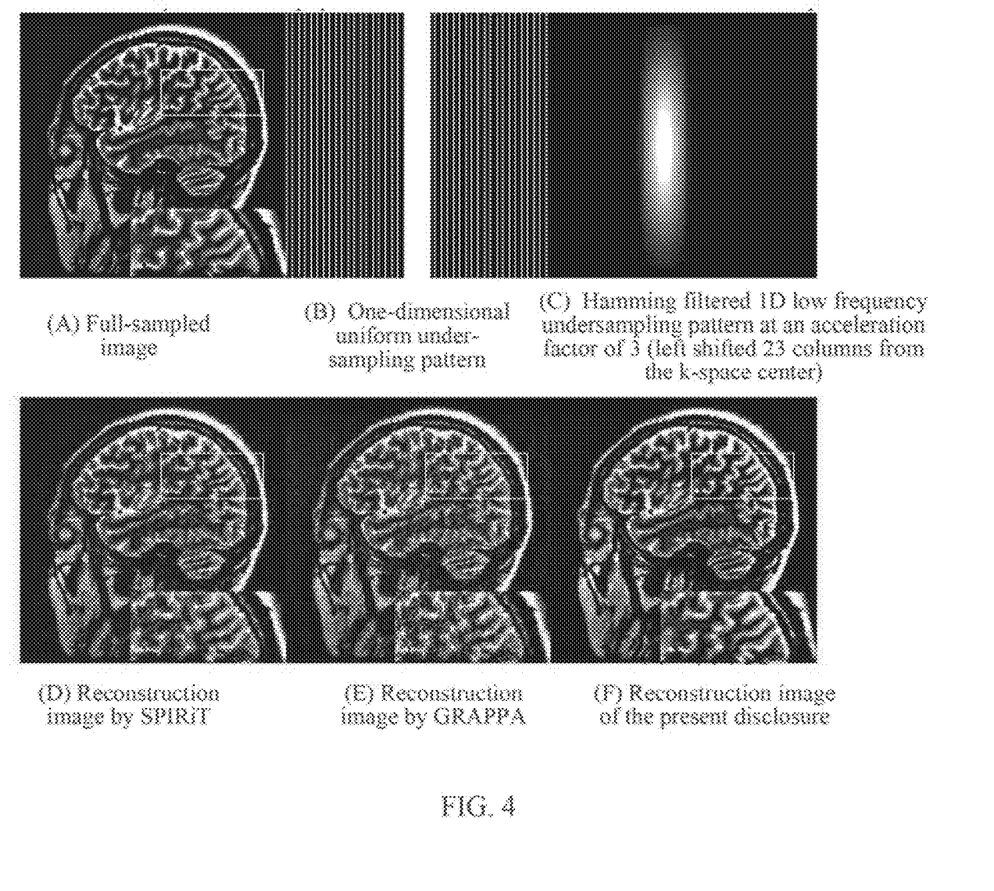
FIG. 4A is a full-sampled image.
FIG. 4B is a one-dimensional uniform undersampling pattern used by GRAPPA and SPIRiT.
FIG. 4C shows a Hamming filtered 1D low frequency undersampling pattern at an acceleration factor of 3 (left shifted 23 columns from the k-space center)
FIG. 4D is a reconstruction visual effect obtained by using SPIRiT.
FIG. 4E is a reconstruction visual effect obtained by using GRAPPA.
FIG. 4F is a reconstruction visual effect obtained by using the method of the present disclosure.

In another preferred embodiment of the present disclosure, the above multi-coil undersampled image is obtained by undersampling a multi-coil full-sampled image in K space by using a Hamming filtered 1D low frequency undersampling pattern at an acceleration factor of 3 (left shifted 23 columns from the k-space center). FIG. 4B is a schematic diagram illustrating a one-dimensional uniform undersampling pattern used by GRAPPA and SPIRiT, and FIG. 4C is a schematic diagram illustrating a Hamming filtered 1D low frequency undersampling pattern at an acceleration factor of 3 (left shifted 23 columns from the k-space center).

Compared with the conventional one-dimensional uniform undersampling pattern used by GRAPPA and SPIRiT, the Hamming filtered 1D low frequency undersampling pattern at an acceleration factor of 3 (left shifted 23 columns from the k-space center) has the advantages that an undersampled image sample set with a higher quality can be obtained. The higher the quality of the training sample set, the more favorable it is for training the deep convolutional network model.

In addition, the greater the number of samples, the better the accuracy of the trained deep convolutional network. Thus, in a specific embodiment of the present disclosure, a training set including a large number of samples is used, includes approximately 650,000 labeled samples, up to 34.8 G in capacity.

Data in a sample needs to be processed before the sample is input into the network model.

Firstly, the undersampling K space is defined as:

$$f = PFu \quad (2)$$

In the formula, P denotes a diagonal matrix of an undersampling pattern, F is a full-sampling Fourier encoding matrix normalized by a formula $F^H F = I$, u denotes a vector matrix of an original image or an offline image, and Fu denotes full-sampling K-space data.

H denotes a Hermitian transform whose zero-padded magnetic resonance image z can be obtained by direct inverse transformation of the observed data, and the expression is as follows:

$$z = F^H P F u \quad (3)$$

According to the related theory of linear algebra, the cyclic convolution of a signal u plus an abrupt change signal p can be expressed as $F^H P F u$, and P in the formula is the diagonal term of Fourier transform p and is a non-zero term.

Further, in order to achieve the objective of the present disclosure, it is necessary to learn a global convolutional neural network from the undersampled Fourier data as much as possible to reconstruct the magnetic resonance image, but considering that the data of the magnetic resonance image obtained in advance is true or corrupted offline, it is necessary to minimize the error by the following objective function.

$$\arg\min_{\Theta} \left\{ \frac{1}{2T} \sum_{t=1}^{T} \|C(z_t; \Theta) - u_t\|_2^2 \right\} \quad (4)$$

C is an end-to-end mapping relationship estimated with a hidden layer parameter $\Theta=\{(W_1,b_1), \ldots (W_l,b_l), \ldots (W_L,b_L)\}$, T is a number of samples extracted from an image, and N is a total number of images.

To increase the robustness of the network, in an embodiment, more training samples may be obtained according to the following formula:

$$\arg\min_{\Theta}\left\{\frac{1}{2TN}\sum_{t=1}^{T}\sum_{n=1}^{N}\|C(x_{t,n};\Theta)-y_{t,n}\|_2^2\right\}. \quad (5)$$

C is an end-to-end mapping relationship estimated with a hidden layer parameter $\Theta=\{(W_1,b_1), \ldots (W_l,b_l), \ldots (W_L,b_L)\}$, T is a number of samples extracted from an image, and N is a total number of images.

In the following description, merely one pair (x, y) is used as a training sample for convenience of expression.

(2) A deep convolutional network model is constructed.

In an example of the deep convolutional network model of the present disclosure, a convolutional neural network model having an input layer, L convolutional layers, and an output layer is created as follows.

The first convolutional layer of the convolutional neural network model is defined as:

$$C_1=\sigma(W_1*x+b_1) \quad (6)$$

$W_1$ is a convolution operator and is equal to $c \times M_1 \times M_1 \times n_l$, $b_1$ is an element-related $n_1$-dimensional offset, c is the number of image channels, $M_1$ is a filter size and $n_l$ is the number of filters.

For a nonlinear response, a rectified linear unit such as a ReLU function or the like is used for more efficient calculation.

Next a nonlinear mapping is further performed, i.e., mapping from $n_{l-1}$ dimension to $n_l$ is performed, and image features and structures are defined by the following formula to represent the entire data reconstructed image:

$$C_l=\sigma(W_l*C_{l-1}+b_l) \quad (7)$$

$W_l$ is a convolution operator and is equal to $n_{l-1} \times M_l \times M_l \times n_l$, $b_l$ is an element-related n-dimensional offset, $M_l$ is a filter size and $n_l$ is the number of filters.

Considering the convolution problem of the last layer, in order to reconstruct the final predicted image from the convolutional neural network, another layer of convolution needs to be constructed, and the final image is predicted by the last-layer activation function.

$$C_L=\sigma(W_L*C_{L-1}+b_L) \quad (8).$$

$W_L$ is a convolution operator and is equal to $n_{L-1} \times M_L \times M_L \times c$, $b_L$ is an element-related $n_L$-dimensional offset, c is the number of image channels, $M_L$ is a filter size and $n_L$ is the number of filters.

Finally, a convolutional neural network with L convolutional layers is designed to learn the mapping relationship:

$$\begin{cases} C_0 = x \\ C_1 = \sigma(W_1*x+b_1) \\ C_l = \sigma(W_l*C_{l-1}+b_l), l \in 2, \ldots, L-1 \\ C_L = \sigma(W_L*C_{L-1}+b_L) \end{cases} \quad (9)$$

Figure 3A:
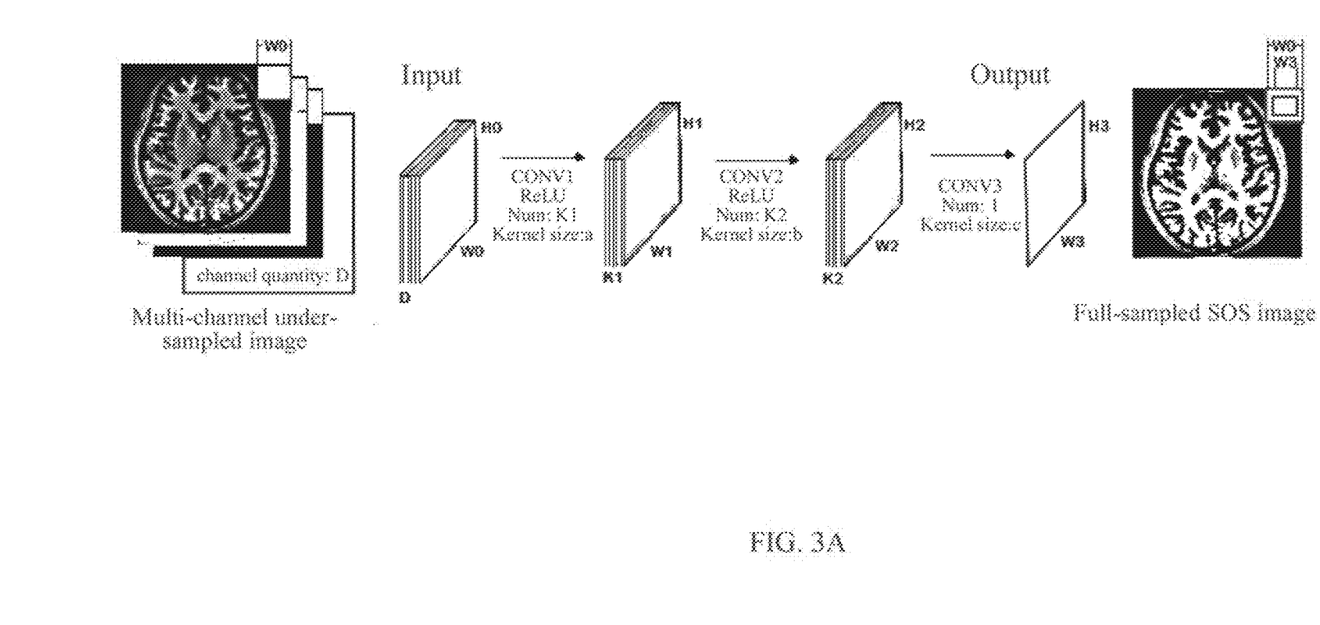
FIG. 3A is a forward conduction process of a sample over a deep convolutional network offline.
Figure 3B:
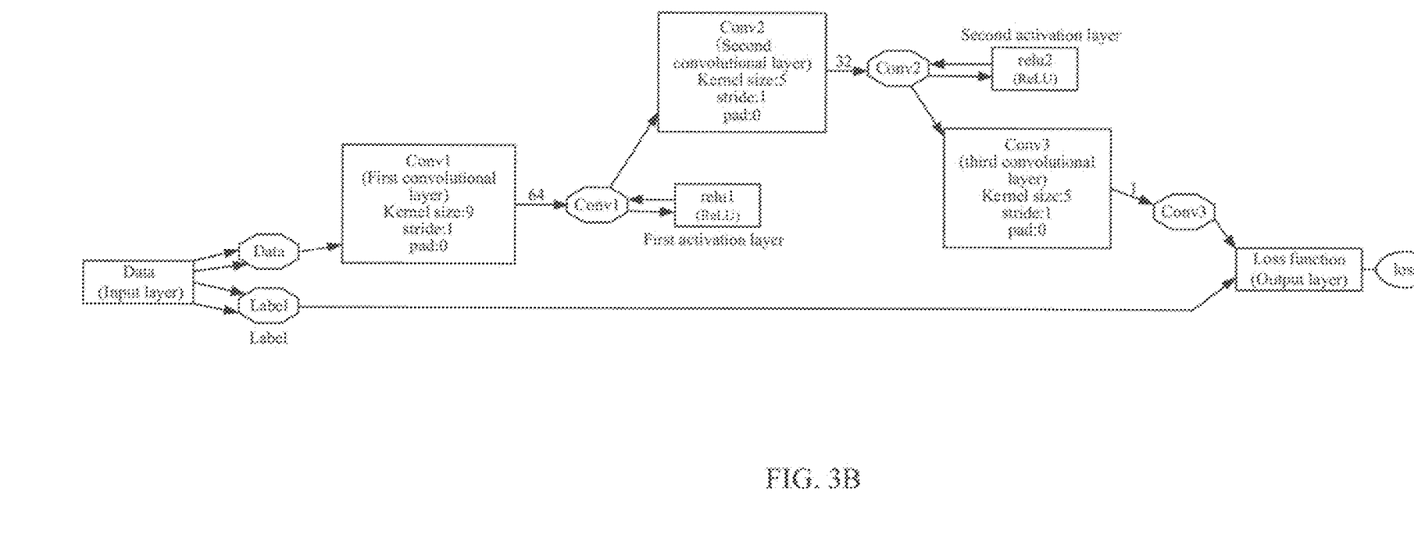
FIG. 3B is an example of a training framework of a deep convolutional network.

Next, a detailed description will be given with reference to the drawings. FIG. 3A and FIG. 3B show an example of a deep convolutional network constructed by the present disclosure, and show the forward conduction process of a sample over the deep convolutional network and the training framework built in a deep learning architecture.

The deep convolutional network model created in FIGS. 3A and 3B includes an input layer data, a first convolutional layer conv1, a second convolutional layer conv2, a third convolutional layer conv3 and an output layer including a loss function. The input layer, the first convolutional layer, the second convolutional layer, the third convolutional layer, and the output layer are sequentially connected.

The structure of the deep convolutional network of the present disclosure is not limited to the examples in FIGS. 3A and 3B. For example, the deep convolutional network model of the present disclosure may include more than three convolutional layers, or may include merely two convolutional layers.

Furthermore, the model further includes a rectified linear unit, for example, a first activation layer relu1 connected to the first convolutional layer and a second activation layer relu2 connected to the second convolutional layer to linearly correct the output of each convolutional layer.

In the embodiment of FIG. 3B, both the first and second activation layers use the ReLU activation function, while the loss layer uses the EuclideanLoss function. ReLU is one type of activation function, and sigmoid, ReLU and other nonlinear activation functions are commonly used in the convolutional neural network.

In this embodiment of the present disclosure, the reason why ReLU is used as the activation function is that saturation of the sigmoid function (i.e., gradient descent is slow in a gentle region where the sigmoid function approaches 1) can be avoided by using the ReLU function, training speed is increased to accelerate image reconstruction, gradient diffusion can be avoided, and accuracy is higher.

(3) A deep convolutional network model is trained.

Next, the training samples are input into the created deep convolutional network model to start the training process.

Firstly, a training sample in the training sample set is input to the network model for forward process, and the output result of forward process is compared with data in a sample label.

The forward process and training process of the sample in the deep convolutional network model shown in FIGS. 3A and 3B are further explained below, taking the sample size of 33×33×12 and the label size of 17×17 as examples.

In FIG. 3A, D denotes the number of channels of the multi-channel coil, the extracted image extraction patch of W0×H0×D is input as a sample to the input layer, and the corresponding sample label is input to the loss layer as shown in FIG. 3B.

In the first convolutional layer, convolution extraction is performed on the input image samples through K1 convolution kernels, and a size of each of the K1 convolution kernels is a. As shown in FIG. 3A, after the input image sample passes through the first convolutional layer, an image feature of W1×H1×k1 is obtained by means of convolutional extracted on the input sample image.

In the embodiment of FIG. 3B, the first convolutional layer conv1 uses a convolution kernel with a weight size of 9×9×12×64 and an offset size of 64×1 and selects a stride of 1 to perform processing in the manner of a non-extended edge (an extended edge value of 0). Here, the obtained image feature can also be linearly corrected through the first activation layer relu1, and the corrected image feature is sent to the next processing layer.

Next, the obtained W1×H1×k1 image feature is subjected to a second convolution extraction at the second convolutional layer.

As shown in FIG. 3A, an image feature of W2×H2×k2 is obtained after the second convolutional layer is passed through. In the embodiment of FIG. 3B, the second convolutional layer conv2 uses a convolution kernel with a weight size of 5×5×64×32, and an offset size of 32×1 and selects a stride of 1 for the second convolution extraction in the manner of a non-extended edge (i.e., an extended edge value of 0). Here, the obtained image feature can be linearly corrected through the second activation layer relu2 and the corrected image feature is sent to the next processing layer.

Next, the obtained image feature of size W2×H2×k2 is sent into the third convolutional layer for similar convolution extraction.

As shown in FIG. 3A, after the third convolutional layer is passed through, a single channel output image of W3×H3 is obtained. In the embodiment of FIG. 3B, the third convolutional layer conv3 uses a convolution kernel with a weight size of 5×5×32×1 and an offset size of 1, and selects a stride of 1 for the third convolution extraction in the manner of a non-extended edge (i.e., an extended edge value of 0), thereby obtaining the output result of forward process.

Next, after the end of the forward process, the output result will be sent to the output layer for comparison with the expected value.

As shown in FIG. 3B, the output image obtained from the third convolutional layer is sent to the loss function (also referred to as an error function) of the output layer so that the output value is compared with the data in the label.

In the deep convolutional network model, the loss layer (loss function) is used for estimating the degree of inconsistency (deviation or error) between a prediction result of an output sample and an ideal result (input label information) to which the sample corresponds. Generally, the smaller the loss function value, the more consistent the predicted result with the ideal result, and the better the robustness of the model. In fact, the entire process of training samples is the process of finding parameters of each layer in the model that minimizes the loss function, and the parameters include the weight and offset parameters of each layer of the network.

In an embodiment of the present disclosure, error backward propagation is performed by using a gradient descent method based on the comparison result (deviation or error). Generally, in the calculation process of the gradient descent method, the gradients of error function (loss function) to all weights and offset values are calculated in a manner of error backward propagation. Specifically, the method starts from any point, moves a distance in the opposite direction of the gradient of that point, and then runs a distance in the opposite direction of the gradient of the new position, and iteration is performed in this way to move to the global minimum point of the function.

For example, for pairs of training samples (x, y), output values of forward process are calculated by equations (5) to (8). In order to update the parameters of each layer of the network, the corresponding gradient is calculated by error backward propagation.

A single pair of targets (x, y) is considered firstly. Equation (4) can be expressed by the following formula:

$$J(\Theta) = \arg\min_{\Theta}\left\{\frac{1}{2}\|C(x;\Theta) - y\|_2^2\right\}. \quad (10)$$

In the formula, $C_l = W_l * C_{l-1} + b_l$.

$\delta^l$ is the gradient of the error term b in the backward propagation and the calculation formula is as follows:

$$\delta^L = \frac{\partial J}{\partial b_L} = \frac{\partial J}{\partial D_L}\frac{\partial D_L}{\partial b_L} = C_L - y. \quad (11)$$

Since $$\frac{\partial D_l}{\partial b_l} = 1 \text{ and } C_l = \sigma(D_l),$$

a gradient of the lth-layer nonlinear mapping layer of $\delta^l$ can be updated by the following formula:

$$\delta^l = \frac{\partial J}{\partial b_l} = \frac{\partial J}{\partial D_{l+1}}\frac{\partial D_{l+1}}{\partial C_l}\frac{\partial C_l}{\partial D_l} = (\delta^{l+1} * W^{l+1}) \circ \frac{\partial (D^l)}{\partial D^l}. \quad (12)$$

In the formula, * denotes a cross-correlation operation, and ° denotes that array elements are sequentially multiplied.

The gradient of each layer is then obtained as:

$$\begin{cases} \frac{\partial J}{\partial W_l} = \frac{\partial J}{\partial D^l}\frac{\partial D^l}{\partial W_l} = \delta^l * D^{l-1} \\ \frac{\partial J}{\partial b_l} = \frac{\partial J}{\partial D^l}\frac{\partial D^l}{\partial b_l} = \frac{\partial J}{\partial D^l} = \delta^l \end{cases} \quad (13)$$

$$\frac{\partial J(\Theta)}{\partial \Theta}.$$

During training, it is customary to calculate the random gradient.

(4) An optimal deep convolutional network model is created.

Based on the calculated gradient of each layer, the weight and offset parameters of each layer of the network are determined, i.e., the calculated gradient is used for updating parameters $W_l$ and $b_l$ by using the gradient descent method, thus acquiring a nonlinear mapping relationship from the undersampled image to the fully-sampled image. That is, the optimal deep convolutional network is created by using the weight and offset parameters obtained from the training in step (3), and can serve as a predictor.

For example, in the embodiment of FIG. 3B, comparison is made with the input labels (i.e., vectors related to the corresponding sample fully-sampled image), a gradient descent method is used for minimizing the loss function, thereby determining the nonlinear mapping relationship between the input undersampled image sample and the corresponding fully-sampled image, i.e., thereby determining the weight and offset parameters of each layer of the network that minimize the loss function, and using the obtained weight and offset parameters to create an optimal deep convolutional network model.

(5) A magnetic resonance image is reconstructed online by using the optimal deep convolutional network model.

A magnetic resonance image can be reconstructed online by using the optimal deep convolutional network model created in step (4), an undersampled multi-coil image sampled online is input into the optimal deep convolutional network for forward conduction, and a full-sampled image is output.

As in the embodiment shown in FIG. 3B, in forward process reconstruction of the magnetic resonance image, the image input into the deep convolutional network model is no longer a segmented image extraction patch, but an entire multi-coil undersampled image.

FIGS. 4D to 4F show a comparison of image reconstruction results respectively obtained by using SPIRiT, GRAPPA and the method of the present disclosure.

The results show that, compared with the current popular methods GRAPPA and SPIRiT by which a magnetic resonance image is reconstructed in K space and noise is brought to the reconstructed image, the one-dimensional partial Fourier parallel magnetic resonance imaging method based on a deep convolutional network provided in the present disclosure performs undersampling in the K space, and uses the trained weight and offset in the spatial domain to reconstruct the magnetic resonance image through forward conduction, which is actually to filter the whole multi-channel undersampled image by using a filter (the filter is the trained weight). Therefore, compared with GRAPPA and SPIRiT, the present disclosure can well remove the noise of the reconstructed image and reconstruct the magnetic resonance image with a better visual effect.

In addition, when an image is reconstructed, the weight and offset parameters are obtained for forward conduction by training the deep network to learn, and the forward conduction speed using parallel computation itself is very fast, so high-speed reconstruction of a magnetic resonance image is another advantage of the present disclosure.

Although the present disclosure is described through the preferred embodiments, modifications, permutations and various equivalent substitutions are possible within the scope of the present disclosure. It is to be noted that there are many alternative ways of implementing the method and system of the present disclosure. Therefore, it is intended that the appended claims shall be construed as including all the modifications, permutations and various equivalent substitutions within the spirit and scope of the present disclosure.

What is claimed is:

1. A one-dimensional partial Fourier parallel magnetic resonance imaging method based on a deep convolutional network, comprising:
creating, based on an existing undersampled multi-channel magnetic resonance image, a sample set and a sample label set for training;
constructing an initial deep convolutional network model comprising an input layer, L convolutional layers and an output layer which are sequentially connected;
inputting a training sample (x, y) of the sample set to the initial deep convolutional network model for forward process, comparing an output result of the forward process with an expected result in the sample label set, and training with a gradient descent method until a parameter of each layer which enables consistency between the output result and the expected result to be maximum is obtained;
creating an optimal deep convolutional network model by using the obtained parameter of the each layer; and
inputting a multi-coil undersampled image sampled online to the optimal deep convolutional network model, performing the forward process on the optimal deep convolutional network model, and outputting a reconstructed full-sampled image;
wherein the gradient descent method comprises:
for the training sample (x, y), calculating a gradient of a last convolutional layer $C_L$ according to the following formula:

$$\delta^L = \frac{\partial J}{\partial b_L} = \frac{\partial J}{\partial D_L}\frac{\partial D_L}{\partial b_L} = C_L - y$$

wherein $\frac{\partial D_l}{\partial b_l} = 1$ and $C_l = \sigma(D_l)$;

updating a gradient of an lth-layer nonlinear mapping layer of $\delta^l$ by the following formula:

$$\delta^l = \frac{\partial J}{\partial b_l} = \frac{\partial J}{\partial D_{l+1}}\frac{\partial D_{l+1}}{\partial C_l}\frac{\partial C_l}{\partial D_l} = (\delta^{l+1} * W^{l+1}) \circ \frac{\partial(D^l)}{\partial D^l}$$

wherein * denotes a cross-correlation operation, and ∘ denotes that array elements are sequentially multiplied;
obtaining a gradient of each of the L convolutional layers as:

$$\begin{cases} \frac{\partial J}{\partial W_l} = \frac{\partial J}{\partial D^l}\frac{\partial D^l}{\partial W_l} = \delta^l * D^{l-1} \\ \frac{\partial J}{\partial b_l} = \frac{\partial J}{\partial D^l}\frac{\partial D^l}{\partial b_l} = \frac{\partial J}{\partial D^l} = \delta^l \end{cases}$$

updating a parameter of the each of the L convolutional layers based on the calculated gradient of the each of the L convolutional layers.

2. The one-dimensional partial Fourier parallel magnetic resonance imaging method based on the deep convolutional network according to claim 1, wherein the training sample in the sample set is a coincident undersampled image extraction patch extracted from an existing offline multi-coil undersampled image, and a sample label in the label set is a square root of a sum of squares of a full-sampled multi-channel image extraction patch corresponding to the undersampled image extraction patch.

3. The one-dimensional partial Fourier parallel magnetic resonance imaging method based on the deep convolutional network according to claim 2, wherein the undersampled image extraction patch used as the training sample is obtained according to the following formula:

$$\arg\min_{\Theta}\left\{\frac{1}{2TN}\sum_{t=1}^{T}\sum_{n=1}^{N}\|C(x_{t,n};\Theta) - y_{t,n}\|_2^2\right\}$$

wherein x is the undersampled image extraction patch, y is the corresponding full-sampled image extraction patch, C is an end-to-end mapping relationship estimated with a hidden layer parameter $\Theta=\{(W_1,b_1), \ldots (W_l,b_l), \ldots (W_L,b_L)\}$, T is a number of samples extracted from an image, and N is a total number of images.

4. The one-dimensional partial Fourier parallel magnetic resonance imaging method based on the deep convolutional network according to claim 1, wherein the existing offline multi-coil undersampled image is obtained by under sampling a K-space multi-coil full-sampled image.

5. The one-dimensional partial Fourier parallel magnetic resonance imaging method based on the deep convolutional network according to claim 1, wherein the L convolutional layers of the initial deep convolutional network model are created in the following manner:

$$\begin{cases} C_0 = x \\ C_1 = \sigma(W_1 * x + b_1) \\ C_l = \sigma(W_l * C_{l-1} + b_l), l \in 2, \ldots, L-1 \\ C_L = \sigma(W_L * C_{L-1} + b_L) \end{cases}$$

wherein C denotes a convolutional layer and x denotes an input sample; in a formula, $W_1$ is a convolution operator of a first convolutional layer $C_1$ and is equal to $c \times M_1 \times M_1 \times n_1$, $b_1$ is an element-related $n_1$-dimensional offset, c is a number of image channels, $M_1$ is a filter size and $n_1$ is a number of filters; $W_l$ is a convolution operator of a l-th convolutional layer $C_l$ and is equal to $n_{l-1} \times M_l \times M_l \times n_l$, $b_l$ is an element-related $n_l$-dimensional offset, $M_l$ is a filter size and $n_l$ is a number of filters; $W_L$ is a convolution operator of a last convolutional layer $C_L$ and is equal to $n_{L-1} \times M_L \times M_L \times c$, wherein $b_L$ is an element-related $n_L$-dimensional offset, c is a number of image channels, $M_L$ is a filter size, and $n_L$ is a number of filters.

6. The one-dimensional partial Fourier parallel magnetic resonance imaging method based on the deep convolutional network according to claim 5, wherein the initial deep convolutional network model further comprises activation layers connected to one or more of the L convolutional layers.

7. The one-dimensional partial Fourier parallel magnetic resonance imaging method based on the deep convolutional network according to claim 6, wherein the activation layers use a ReLu activation function.

8. The one-dimensional partial Fourier parallel magnetic resonance imaging method based on the deep convolutional network according to claim 5, wherein the initial deep convolutional network model comprises the input layer, a first convolutional layer, a second convolutional layer, a third convolutional layer and the output layer, wherein the first convolutional layer is connected to a first activation layer and the second convolutional layer is connected to a second activation layer.

9. The one-dimensional partial Fourier parallel magnetic resonance imaging method based on the deep convolutional network according to claim 8, wherein the output layer uses an EuclideanLoss function.

10. A one-dimensional partial Fourier parallel magnetic resonance imaging apparatus based on a deep convolutional network, comprising:
a module configured to create, based on an existing undersampled multi-channel magnetic resonance image, a sample set and a sample label set for training;
a module configured to construct an initial deep convolutional network model comprising an input layer, L convolutional layers and an output layer which are sequentially connected;
a module configured to input a training sample (x, y) of the sample set to the initial deep convolutional network model for forward process, compare an output result of the forward process with an expected result in the sample label set, and perform training with a gradient descent method until a parameter of each layer which enables consistency between the output result and the expected result to be maximum is obtained;
a module configured to create an optimal deep convolutional network model by using the obtained parameter of the each layer; and
a module configured to input a multi-coil undersampled image sampled online to the optimal deep convolutional network model, perform the forward process on the optimal deep convolutional network model, and output a reconstructed full-sampled image;
wherein the gradient descent method comprises:
for the training sample (x, y), calculating a gradient of a last convolutional layer $C_L$ according to the following formula:

$$\delta^L = \frac{\partial J}{\partial b_L} = \frac{\partial J}{\partial D_L} \frac{\partial D_L}{\partial b_L} = C_L - y$$

wherein $\frac{\partial D_l}{\partial b_l} = 1$ and $C_l = \sigma(D_l)$;

updating a gradient of an lth-layer nonlinear mapping layer of $\delta^l$ by the following formula:

$$\delta^l = \frac{\partial J}{\partial b_l} = \frac{\partial J}{\partial D_{l+1}} \frac{\partial D_{l+1}}{\partial C_l} \frac{\partial C_l}{\partial D_l} = (\delta^{l+1} * W^{l+1}) \circ \frac{\partial (D^l)}{\partial D^l}$$

wherein * denotes a cross-correlation operation, and ∘ denotes that array elements are sequentially multiplied;
obtaining a gradient of each of the L convolutional layers as:

$$\begin{cases} \frac{\partial J}{\partial W_l} = \frac{\partial J}{\partial D^l} \frac{\partial D^l}{\partial W_l} = \delta^l * D^{l-1} \\ \frac{\partial J}{\partial b_l} = \frac{\partial J}{\partial D^l} \frac{\partial D^l}{\partial b_l} = \frac{\partial J}{\partial D^l} = \delta^l \end{cases}$$

updating a parameter of the each of the L convolutional layers based on the calculated gradient of the each of the L convolutional layers.

11. A non-transitory computer readable medium, which is configured to store programs, wherein the programs are computer-executable and cause a computer to perform processing comprising:
creating, based on an existing undersampled multi-channel magnetic resonance image, a sample set and a sample label set for training;
constructing an initial deep convolutional network model comprising an input layer, L convolutional layers and an output layer which are sequentially connected;
inputting a training sample (x, y) of the sample set to the initial deep convolutional network model for forward process, comparing an output result of the forward process with an expected result in the sample label set, and performing training with a gradient descent method until a parameter of each layer which enables consistency between the output result and the expected result to be maximum is obtained;

creating an optimal deep convolutional network model by using the obtained parameter of each layer; and inputting a multi-coil undersampled image sampled online to the optimal deep convolutional network model, performing the forward process on the optimal deep convolutional network model, and outputting a reconstructed full-sampled image;

wherein the gradient descent method comprises:

for the training sample (x, y), calculating a gradient of a last convolutional layer $C_L$ according to the following formula:

$$\delta^L = \frac{\partial J}{\partial b_L} = \frac{\partial J}{\partial D_L}\frac{\partial D_L}{\partial b_L} = C_L - y$$

wherein $\frac{\partial D_l}{\partial b_l} = 1$ and $C_l = \sigma(D_l)$;

updating a gradient of an lth-layer nonlinear mapping layer of $\delta^l$ by the following formula:

$$\delta^l = \frac{\partial J}{\partial b_l} = \frac{\partial J}{\partial D_{l+1}}\frac{\partial D_{l+1}}{\partial C_l}\frac{\partial C_l}{\partial D_l} = (\delta^{l+1} * W^{l+1}) \circ \frac{\partial(D^l)}{\partial D^l}$$

wherein * denotes a cross-correlation operation, and ° denotes that array elements are sequentially multiplied;

obtaining a gradient of each of the L convolutional layers as:

$$\begin{cases} \frac{\partial J}{\partial W_l} = \frac{\partial J}{\partial D^l}\frac{\partial D^l}{\partial W_l} = \delta^l * D^{l-1} \\ \frac{\partial J}{\partial b_l} = \frac{\partial J}{\partial D^l}\frac{\partial D^l}{\partial b_l} = \frac{\partial J}{\partial D^l} = \delta^l \end{cases}$$

updating a parameter of the each of the L convolutional layers based on the calculated gradient of the each of the L convolutional layers.

12. The computer readable medium according to claim 11, wherein a training sample in the sample set is a coincident undersampled image extraction patch extracted from an existing offline multi-coil undersampled image, and a sample label in the label set is a square root of a sum of squares of a full-sampled multi-channel image extraction patch corresponding to the undersampled image extraction patch.

13. The computer readable medium according to claim 12, wherein the undersampled image extraction patch as the training sample is obtained according to the following formula:

$$\arg\min_{\Theta}\left\{\frac{1}{2TN}\sum_{i=1}^{T}\sum_{n=1}^{N}\|C(x_{t,n};\Theta) - y_{t,n}\|_2^2\right\}$$

wherein x is the undersampled image extraction patch, y is the corresponding full-sampled image extraction patch, C is an end-to-end mapping relationship estimated with a hidden layer parameter $\Theta = \{(W_1,b_1), \ldots (W_l,b_l), \ldots (W_L,b_L)\}$, T is a number of samples extracted from an image, and N is a total number of images.

14. The computer readable medium according to claim 11, wherein the existing offline multi-coil undersampled image is obtained by under sampling a K-space multi-coil full-sampled image.

15. The computer readable medium according to claim 11, wherein the L convolutional layers of the initial deep convolutional network model are created in a following manner:

$$\begin{cases} C_0 = x \\ C_1 = \sigma(W_1 * x + b_1) \\ C_l = \sigma(W_l * C_{l-1} + b_l), l \in 2, \ldots, L-1 \\ C_L = \sigma(W_L * C_{L-1} + b_L) \end{cases}$$

wherein C denotes a convolutional layer and x denotes an input sample; in a formula, $W_1$ is a convolution operator of a first convolutional layer $C_1$ and is equal to $c \times M_1 \times M_1 \times n_1$, $b_1$ is an element-related $n_1$-dimensional offset, c is a number of image channels, $M_1$ is a filter size and $n_1$ is a number of filters; $W_l$ is a convolution operator of a l-th convolutional layer $C_l$ and is equal to $n_{l-1} \times M_l \times M_l \times n_l$, $b_l$ is an element-related $n_l$-dimensional offset, $M_l$ is a filter size and $n_l$ is a number of filters; $W_L$ is a convolution operator of a last convolutional layer $C_L$ and is equal to $n_{L-1} \times M_L \times M_L \times c$, wherein $b_L$ is an element-related $n_L$-dimensional offset, c is a number of image channels, $M_L$ is a filter size, and $n_L$ is a number of filters.

16. The computer readable medium according to claim 15, wherein the initial deep convolutional network model further comprises activation layers connected to one or more of the L convolutional layers.

17. The computer readable medium according to claim 16, wherein the activation layers use a ReLu activation function, and the output layer uses an EuclideanLoss function.

18. The computer readable medium according to claim 15, wherein the initial deep convolutional network model comprises the input layer, a first convolutional layer, a second convolutional layer, a third convolutional layer and the output layer, wherein the first convolutional layer is connected to a first activation layer and the second convolutional layer is connected to a second activation layer.

* * * * *